US008507873B2

(12) United States Patent
Shinkawa et al.

(10) Patent No.: US 8,507,873 B2
(45) Date of Patent: Aug. 13, 2013

(54) DRIFT MEASURING METHOD, CHARGED PARTICLE BEAM WRITING METHOD, AND CHARGED PARTICLE BEAM WRITING APPARATUS

(75) Inventors: Shunji Shinkawa, Shizuoka (JP); Kouji Fukushima, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 359 days.

(21) Appl. No.: 12/767,999

(22) Filed: Apr. 27, 2010

(65) Prior Publication Data

US 2010/0270475 A1   Oct. 28, 2010

(30) Foreign Application Priority Data

Apr. 28, 2009  (JP) ................................. 2009-109013

(51) Int. Cl.
*H01J 3/14*  (2006.01)
(52) U.S. Cl.
USPC ........................ 250/397; 250/396 R; 250/398
(58) Field of Classification Search
None
See application file for complete search history.

(56) References Cited

U.S. PATENT DOCUMENTS

| | | | | |
|---|---|---|---|---|
| 3,866,210 A | * | 2/1975 | Lokerson et al. | 345/25 |
| 4,123,798 A | * | 10/1978 | Cook et al. | 365/237 |
| 4,551,655 A | * | 11/1985 | Timmermans et al. | 315/370 |
| 4,769,523 A | * | 9/1988 | Tanimoto et al. | 219/121.6 |
| 4,885,472 A | * | 12/1989 | Young | 250/491.1 |
| 5,093,616 A | * | 3/1992 | Seitoh et al. | 324/754.22 |
| 5,149,976 A | * | 9/1992 | Sipma | 250/492.2 |
| 5,847,974 A | * | 12/1998 | Mori et al. | 702/94 |
| 5,877,505 A | * | 3/1999 | Fujino | 250/491.1 |
| 5,892,237 A | * | 4/1999 | Kawakami et al. | 250/492.22 |
| 6,590,633 B1 | * | 7/2003 | Nishi et al. | 355/53 |
| 7,276,694 B1 | * | 10/2007 | Bertsche | 250/311 |
| 2001/0003655 A1 | * | 6/2001 | Tokunaga | 438/1 |
| 2002/0102470 A1 | * | 8/2002 | Lercel | 430/5 |
| 2003/0085352 A1 | * | 5/2003 | Lezec et al. | 250/306 |

FOREIGN PATENT DOCUMENTS

| | | | |
|---|---|---|---|
| JP | 03101041 A | * | 4/1991 |
| JP | 03138842 A | * | 6/1991 |
| JP | 9-161715 | | 6/1997 |
| JP | 9-161715 A | | 6/1997 |
| JP | 09161715 A | * | 6/1997 |
| JP | 9-293670 | | 11/1997 |
| JP | 09293670 A | * | 11/1997 |

* cited by examiner

*Primary Examiner* — Andrew Smyth
(74) *Attorney, Agent, or Firm* — Oblon, Spivak, McClelland, Maier & Neustadt, L.L.P.

(57) ABSTRACT

A detector 32 measures the value of the current formed by reflected electrons generated as a result of irradiation of a reference mark on a substrate with an electron beam 54, where the reference mark is made of a material having a different reflectance than the substrate. The signal from the detector 32 is amplified by a detecting unit 33 and converted to a digital signal by an A/D conversion unit 34. A control computer 19 then performs averaging processing on the digital signal which is then used for drift compensation by a writing data correcting unit 31.

14 Claims, 4 Drawing Sheets

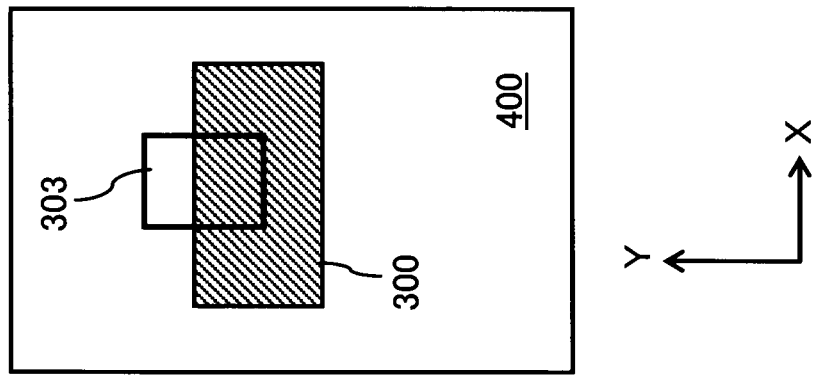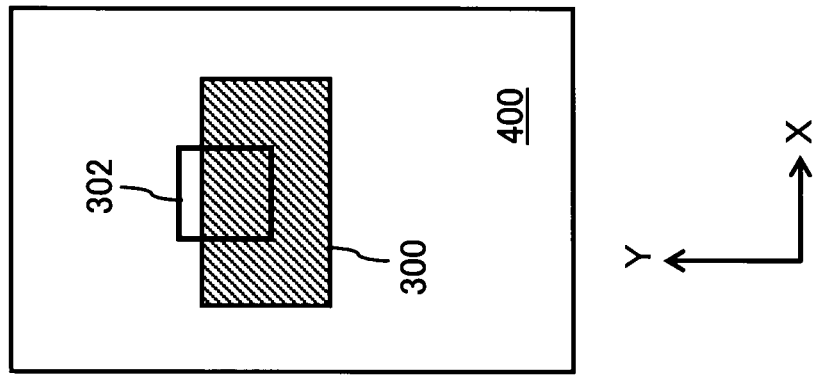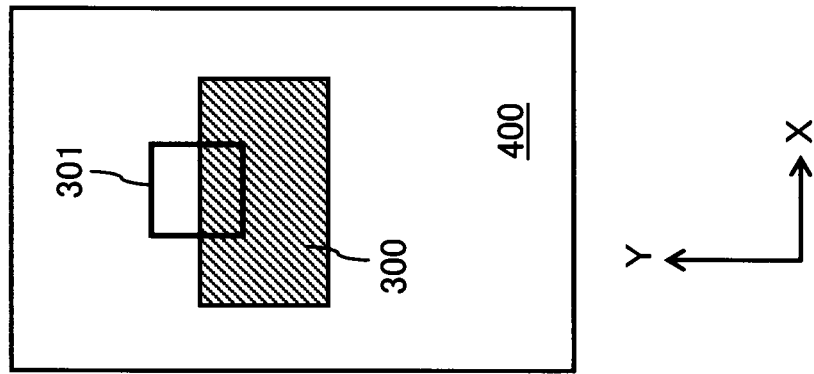

DRIFT MEASURING METHOD, CHARGED PARTICLE BEAM WRITING METHOD, AND CHARGED PARTICLE BEAM WRITING APPARATUS

BACKGROUND OF THE INVENTION

1. Field of the Invention

The present invention relates to a drift measuring method, a charged particle beam writing method, and a charged particle beam writing apparatus.

2. Background Art

Recently, along with the development of higher levels of integration in semiconductor integrated circuits, there has been a trend toward finer and more complicated LSI (Large Scale Integration) patterns. Therefore, effort is being made to develop an electron beam lithographic technique for writing a pattern with an electron beam directly instead of using photolithography.

Electron beam lithography inherently provides a superior resolution, since it uses electron beams, which are a type of charged particle beam. This technology is also advantageous in that great depth of focus is obtained, which enables dimensional variations to be reduced even when a large step feature is encountered. For this reason, the technology has been applied to the development of state-of-the-art devices typified by DRAM, as well as to the production of some ASICs. Further, electron beam lithography is widely used in the manufacture of masks or reticles used as original artwork for transferring an LSI pattern to the wafer.

Japanese Laid-Open Patent Publication No. 9-293670 (1997) discloses a variable shape electron beam writing apparatus used for electron beam lithography.

The pattern writing data for such apparatus is prepared by using design data (CAD data) of a semiconductor integrated circuit, etc. designed by a CAD system and processing it, such as correcting the data and dividing the pattern. For example, the pattern is divided into segments each the size of the maximum shot size, which is defined by the size of the electron beam. After this division of the pattern, the apparatus sets the coordinate positions and size of each shot and the radiation time. Pattern writing data is then produced which is used to shape the shot in accordance with the shape and size of the pattern or pattern segment to be written. The pattern writing data is divided into pieces each corresponding to a strip-shaped frame (or main deflection region), and each frame is divided into sub-deflection regions. That is, the pattern writing data for the entire chip has a hierarchical data structure in which data of each of a plurality of strip-shaped frames, which correspond to the main reflection regions, is divided into a plurality of pieces of data each representing one of the plurality of sub-reflection regions (smaller in size than the main deflection regions) in the frame.

The electron beam is scanned over each sub-deflection region by the sub-deflector at higher speed than it is scanned over each main deflection region; the sub-deflection regions are generally the smallest writing fields. When writing on each sub-deflection region, the shaping deflector forms a shot of a size and shape corresponding to the pattern or pattern segment to be written. Specifically, the electron beam emitted from the electron gun is shaped into a rectangular shape by a first aperture and then projected to a second aperture by the shaping deflector, resulting in a change in the shape and size of the beam. The electron beam is then deflected by the sub-deflector and the main deflector and directed onto the mask mounted on the stage, as described above.

Incidentally, irradiating the mask with the electron beam results in generation of reflected electrons. These reflected electrons impinge onto the optical system, detectors, etc. in the electron beam writing apparatus, and as a result, charges are built up, thereby generating a new electric field. This changes the path of the electron beam that has been deflected toward the mask, resulting in displacement of the beam from the desired impinging position or writing position on the mask, which is referred to as "beam drift." Although other problems can cause beam drift, in any case it is necessary to make corrections to cause the beam to impinge at the desired location on the mask by detecting the reference mark position on the stage in the middle of the write operation and determining the amount of beam drift. Specifically, the coordinates of the reference mark are measured twice; once immediately before initiating a write operation and once after temporarily interrupting the write operation during the process. The difference between these measured coordinate values is then calculated to determine the amount of drift.

A common conventional method for measuring the position of the reference mark is to scan an electron beam over the reference mark and measure the intensity of the reflected electrons. With this method, however, it takes approximately 0.5 milliseconds to obtain each piece of data, including the time required for communication. As a result, the conventional method has not been able to measure beam drift in a time on the order of microseconds.

The present invention has been made in view of the above problems. It is, therefore, an object of the present invention to provide a drift measuring method, a charged particle beam writing method, and a charged particle beam writing apparatus capable of measuring beam drift in a shorter time than conventionally possible.

Other challenges and advantages of the present invention are apparent from the following description.

SUMMARY OF THE INVENTION

According to one aspect of the present invention, in a method of measuring drift of a charged particle beam, the charged particle beam is irradiated on a portion that includes both the surface of a substrate and a part of a reference mark formed on the substrate and made of a material having a different reflectance than the substrate. And also the charged particle beam is irradiated onto a portion of the surface of the substrate contiguously adjacent the reference mark. The value of a current formed by reflected charged particles generated as a result of the irradiation is measured. The drift of the charged particle beam is measured based on the amount of change in the current value.

According to another aspect of the present invention, in a method of writing with a charged particle beam, the charged particle beam is irradiated a portion that includes both the surface of a substrate and a part of a reference mark formed on the substrate and made of a material having a different reflectance than the substrate. And also the charged particle beam is irradiated onto a portion of the surface of the substrate contiguously adjacent the reference mark. The value of a current formed by reflected charged particles generated as a result of the irradiation is measured. The amount of change in the position of the charged particle beam due to drift of the charged particle beam is determined based on the amount of change in the current value and the impinging position of the charged particle beam is corrected accordingly.

According to other aspect of the present invention, a charged particle beam writing apparatus comprises a reference mark on a substrate provided in a writing chamber in which a workpiece is placed, the reference mark being of a material having a different reflectance than the substrate, a detector configured to measure the value of a current formed by reflected charged particles generated as a result of irradiation of the reference mark with a charged particle beam, and a correcting unit configured to perform drift compensation based on a signal from the detector. The correcting unit calculates the amount of change in the position of the charged particle beam due to drift of the charged particle beam and corrects the impinging position of the charged particle beam accordingly.

BRIEF DESCRIPTION OF THE DRAWINGS

FIG. 4A to 4C are schematic diagrams illustrating positional drift and shape drift according to the present embodiment.

DETAILED DESCRIPTION OF THE EMBODIMENTS

Figure 1:
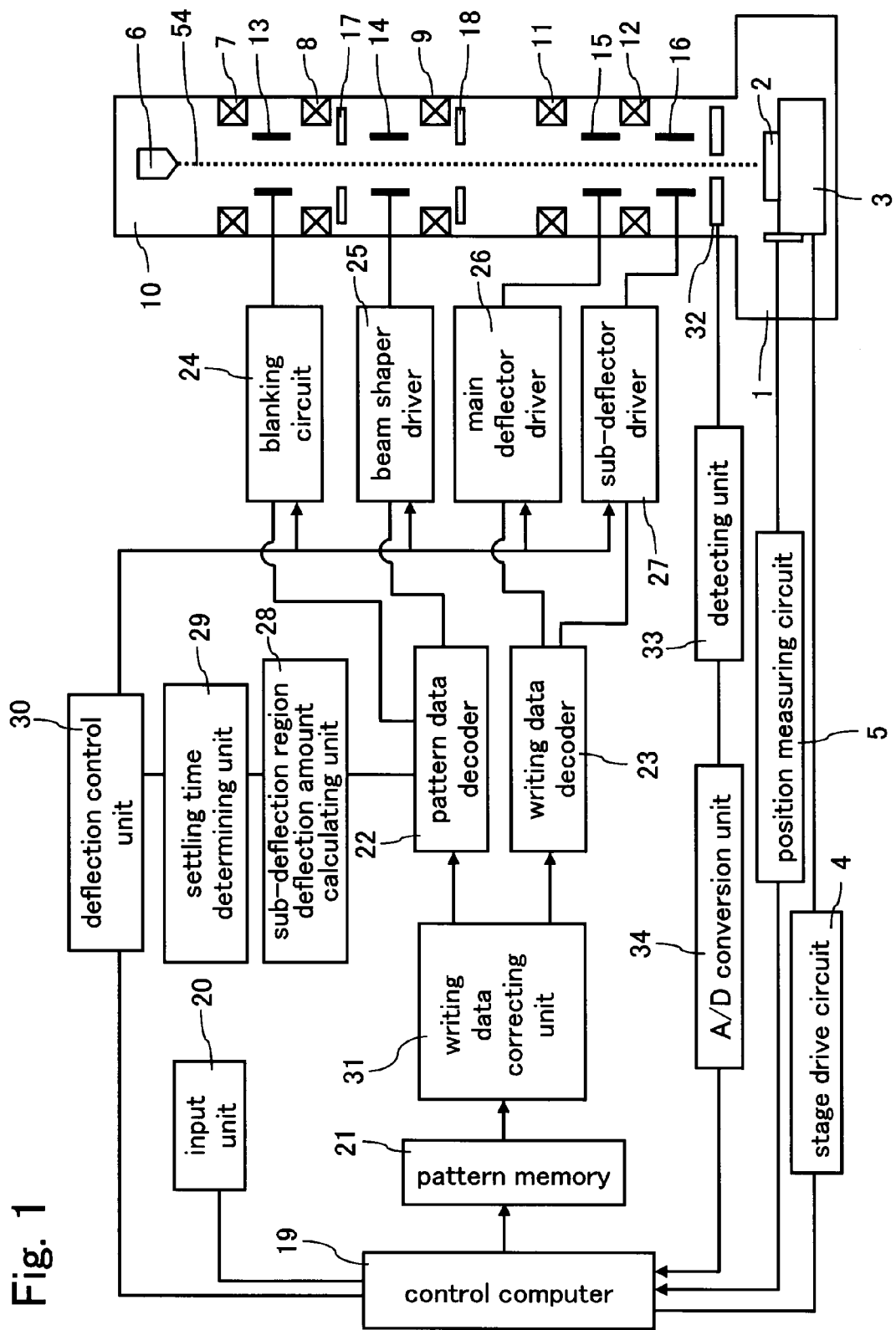
FIG. 1 is a schematic view showing the configuration of an electron beam writing apparatus according to an embodiment of the present invention.

FIG. 1 is a schematic view showing the configuration of an electron beam writing apparatus according to an embodiment of the present invention.

Referring to FIG. 1, this electron beam writing apparatus includes a writing unit for writing on a workpiece with an electron beam, and a control unit for controlling the write operation. A writing chamber 1 houses a stage 3 on which a workpiece 2 is mounted. A stage drive circuit 4 causes the stage 3 to move in the X direction (i.e., the lateral direction as viewed in FIG. 1) and the Y direction (i.e., the direction perpendicular to the plane of the paper). The position of the stage 3 is measured by a position measuring circuit 5 using a laser-based measuring device, etc.

The workpiece 2 has a reference mark (not shown) for measuring the amount of beam drift. This reference mark is made of a material having a different reflectance than the workpiece surface.

It should be noted that in the present embodiment the reference mark may be disposed outside the workpiece surface but as close to it as possible. In such a case, for example, the reference mark may be formed by first forming a tungsten film on a silicon substrate and then etching this tungsten film into a cross shape. Further, the reference mark may be a film of a heavy metal other than tungsten.

Above the writing chamber 1 is disposed a detector 32 for measuring the value of the current formed by electrons reflected from the reference mark when the mark is irradiated with the electron beam. It should be noted that the detector 32 may measure the value of the current formed by secondary electrons in addition to, or instead of, the reflected electrons. The electrical signal output from the detector 32 is input to a detecting unit 33. The detecting unit 33 amplifies the signal which is then applied to an A/D conversion unit 34. The A/D conversion unit 34 converts the analog signal received from the detecting unit 33 to a digital signal. The digital signal is then sent to a control computer 19. It should be noted that the A/D conversion unit 34 can store data received from the detecting unit 33, thus eliminating the need to send data to the control computer 19 each time a measurement is made. This reduces the time required for communication, thereby reducing the sampling time.

An electron beam optical system 10 is also disposed above the writing chamber 1. The electron beam optical system 10 includes an electron gun 6, various lenses 7, 8, 9, 11 and 12, a blanking deflector 13, a shaping deflector 14, a main deflector 15 and a sub-deflector 16 for beam scanning, and two beam shaping apertures 17 and 18.

Figure 2:
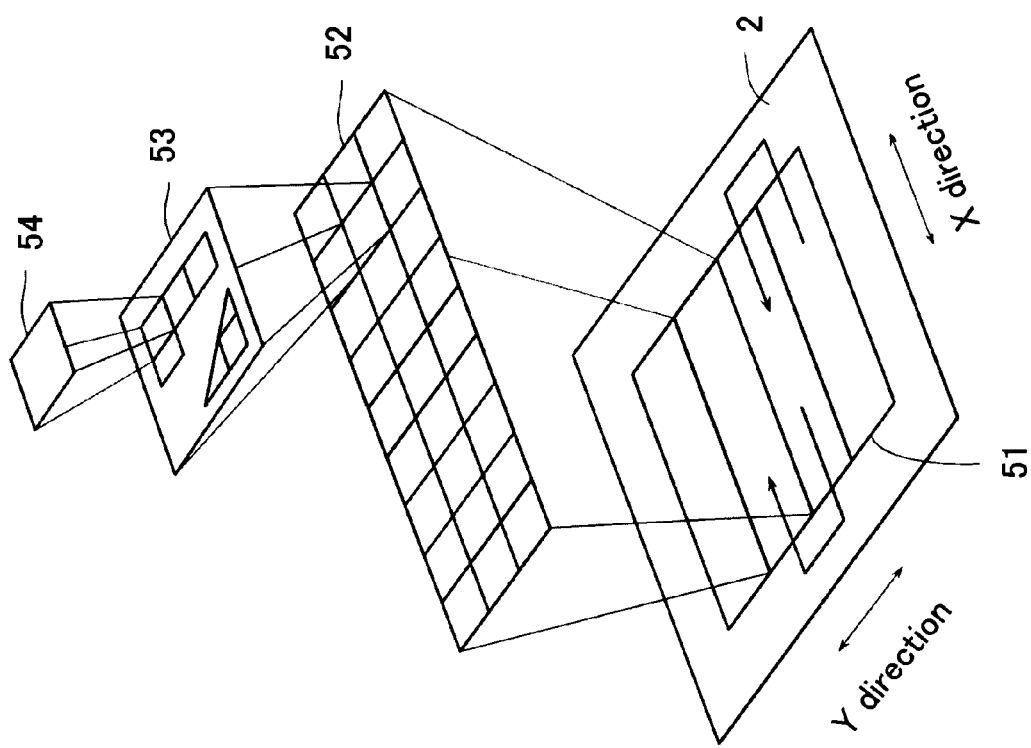
FIG. 2 is a schematic diagram illustrating an electron beam writing method.

FIG. 2 is a schematic diagram illustrating an electron beam writing method. As shown in this figure, a pattern 51 to be written on the mask 2 is divided into strip-shaped frame regions 52. The pattern is written on the mask 2 by an electron beam 54 on a frame region basis while the stage 3 is continuously moved in one direction (e.g., the X direction). Each frame region 52 is divided into sub-deflection regions 53, and the pattern writing is performed only on a selected portion or portions of the sub-deflection regions 53 by the electron beam 54. It will be noted that the frame regions 52 are strip-shaped writing fields whose size is determined by the deflection width of the main deflector 15, and the sub-deflection regions 53 are unit writing fields whose size is determined by the deflection width of the sub-deflector 16.

The main deflector 15 positions the electron beam at a reference position in a sub-deflection region 53, and the sub-deflector 16 scans the electron beam over the sub-deflection region 53 for pattern writing. That is, the electron beam 54 is first positioned at a predetermined sub-deflection region 53 by the main deflector 15 and then positioned at a target writing position in the sub-deflection region 53 by the sub-deflector 16. Further, the shape and size of the electron beam 54 are controlled by the shaping deflector 14 and the beam shaping apertures 17 and 18. Writing is then performed on the sub-deflection region 53 while the stage is continuously moved in one direction. Upon completion of the writing on this sub-deflection region 53, the writing on the next sub-deflection region 53 is initiated. Further, upon completion of the writing on all the sub-deflection regions 53 in the current frame region 52, the stage 3 is moved one step in a direction perpendicular to the direction of the above continuous movement of the stage 3 (e.g., in the Y direction) and then the next frame region 52 is subjected to a write operation. This procedure is repeated to write on one frame region 52 after another.

Referring to FIG. 1, the reference numeral 20 denotes an input unit through which pattern writing data for the mask 2 is input from a magnetic disk (a storage medium) to the electron beam writing apparatus. The pattern writing data read from the input unit 20 is temporarily stored in pattern memory 21 on a frame region basis. The pattern data for each frame region 52 stored in the pattern memory 21, that is, frame information which includes pattern writing position data, pattern shape data, etc., is corrected by a writing data correcting unit 31 and then sent to a pattern data decoder 22 and a writing data decoder 23 which serve as data analysis units.

The writing data correcting unit 31 performs drift compensation on original design value data. Specifically, a compensation value for the drift compensation is calculated based on the data input to the control computer 19 from the A/D conversion unit 34. The design value data and the compensation value data are added or combined together.

The writing data correcting unit 31 then corrects the drift-compensated design value data so that it reflects the position of the stage 3. Specifically, the position data of the stage 3 obtained by the position measuring circuit 5 is sent to the writing data correcting unit 31 which adds the position data to the drift-compensated design value data. The resulting data is sent to the pattern data decoder 22 and the writing data decoder 23.

The information from the pattern data decoder 22 is sent to a blanking circuit 24 and a beam shaper driver 25. Specifically, the pattern data decoder 22 generates blanking data based on the data received from the writing data correcting unit 31 and sends it to the blanking circuit 24. The pattern data decoder 22 also generates the desired beam size data and sends it to the beam shaper driver 25. The beam shaper driver 25 then applies a predetermined deflection signal to the shaping deflector 14 in the electron beam optical system 10 to adjust the size of the electron beam 54.

Referring still to FIG. 1, a deflection control unit 30 is connected to a settling time determining unit 29 which is connected to a sub-deflection region deflection amount calculating unit 28. The sub-deflection region deflection amount calculating unit 28 is also connected to the pattern data decoder 22. Further, the deflection control unit 30 is also connected to the blanking circuit 24, the beam shaper driver 25, the main defector driver 26, and the sub-deflector driver 27.

The output from the writing data decoder 23 is sent to the main deflector driver 26 and the sub-deflector driver 27. The main deflector driver 26 then applies a predetermined deflection signal to a main deflector 15 in the electron beam optical system 10 to deflect the electron beam 54 to a predetermined main deflection position. Further, the sub-deflector driver 27 applies a predetermined sub-deflection signal to the sub-deflector 16 to write on a sub-deflection region 53.

A writing method using the electron beam writing apparatus will now be described.

First, the mask 2 is mounted on the stage 3 in the writing chamber 1. Next, the position measuring circuit 5 measures the position of the stage 3, and in response to a signal from the control computer 19, the stage drive circuit 4 moves the stage 3 to position where writing is possible.

The electron gun 6 then emits the electron beam 54. The emitted electron beam 54 is focused by an illumination lens 7. The blanking deflector 13 operates so that the mask 2 is either irradiated with the electron beam 54 or not irradiated with electron beam 54.

The electron beam 54 directed to the first aperture 17 passes through the opening of the first aperture 17 and is deflected by the shaping deflector 14 controlled by the beam shaper driver 25. The electron beam 54 is then passed through the opening of the second aperture 18 so that the beam 54 assumes the desired shape and size. This beam shape corresponds to the smallest writing area on the mask 2 that can be independently irradiated with the electron beam 54.

After thus being shaped into the desired beam shape, the electron beam 54 is reduced in size by the reducing lens 11. The impinging position of the electron beam 54 on the mask 2 is adjusted by the main deflector 15 and the sub-deflector 16 controlled by the main deflector driver 26 and the sub-deflector driver 27, respectively. The main deflector 15 positions the electron beam 54 at a sub-deflection region 53 on the mask 2, and the sub-deflector 16 then positions the electron beam 54 at a writing position in the sub-deflection region 53.

When writing on the mask 2 with the electron beam 54, the beam 54 is caused to scan the mask while the stage 3 is moved in one direction. Specifically, a pattern is written in each sub-deflection region 53 while the stage 3 is moved in one direction. Upon completion of the writing on all the sub-deflection regions 53 in one frame region 52, the stage 3 is moved to a new frame region 52 and the above procedure is repeated to write on the new frame region 52.

After the completion of the writing on all frame regions 52 of the mask 2, the mask is replaced by a new mask and the above writing method is repeated.

The writing control by the control computer 19 will now be described.

The control computer 19 reads pattern writing data for a mask from a magnetic disk through the input unit 20. The read pattern writing data is temporarily stored in the pattern memory 21 on a frame region basis.

The pattern writing data for each frame region 52 stored in the pattern memory 21, that is, frame information which includes pattern writing position data, pattern shape data, etc., is corrected by the writing data correcting unit 31, as described above, and then sent to the sub-deflection region deflection amount calculating unit 28, the blanking circuit 24, the beam shaper driver 25, the main deflector driver 26, and the sub-deflector driver 27 through the pattern data decoder 22 and the writing data decoder 23 which serve as data analysis unit.

The pattern data decoder 22 produces blanking data based on the pattern writing data and sends it to the blanking circuit 24. The pattern data decoder 22 also produces the desired beam shape data based on the pattern writing data and sends it to the sub-deflection region deflection amount calculating unit 28 and the beam shaper driver 25.

The sub-deflection region deflection amount calculating unit 28 calculates the amount of electron beam deflection (or electron beam travel distance) for each shot in the sub-deflection regions 53 based on the beam shape data produced by the pattern data decoder 22. The resulting information is sent to the settling time determining unit 29, which determines a settling time corresponding to the distance of travel of the electron beam due to the sub-deflection.

The settling time determined by the settling time determining unit 29 is sent to the deflection control unit 30, and the deflection control unit 30 sends it to the blanking circuit 24, the beam shaper driver 25, the main deflector driver 26, or the sub-deflector driver 27, depending on the pattern writing timing.

The beam shaper driver 25 applies a predetermined deflection signal to the shaping deflector 14 in the electron beam optical system 10 to adjust the shape and size of the electron beam 54.

The writing data decoder 23 generates, based on the pattern writing data, data for positioning the electron beam 54 at a sub-deflection region 53, and sends it to the main deflector driver 26. The main deflector driver 26 then applies a predetermined deflection signal to the main deflector 15 to deflect the electron beam 54 to a predetermined position in the sub-deflection region 53.

The writing data decoder 23 also generates, based on the pattern writing data, a control signal for the sub-deflector 16 to scan the beam. This control signal is sent to the sub-deflector driver 27 which then applies a predetermined sub-deflection signal to the sub-deflector 16. The sub-deflection region 53 is repeatedly radiated with the electron beam 54 for pattern writing after the set settling time has elapsed.

A method of measuring the amount of beam drift according to the present embodiment will now be described with reference to FIG. 3.

Figure 3:
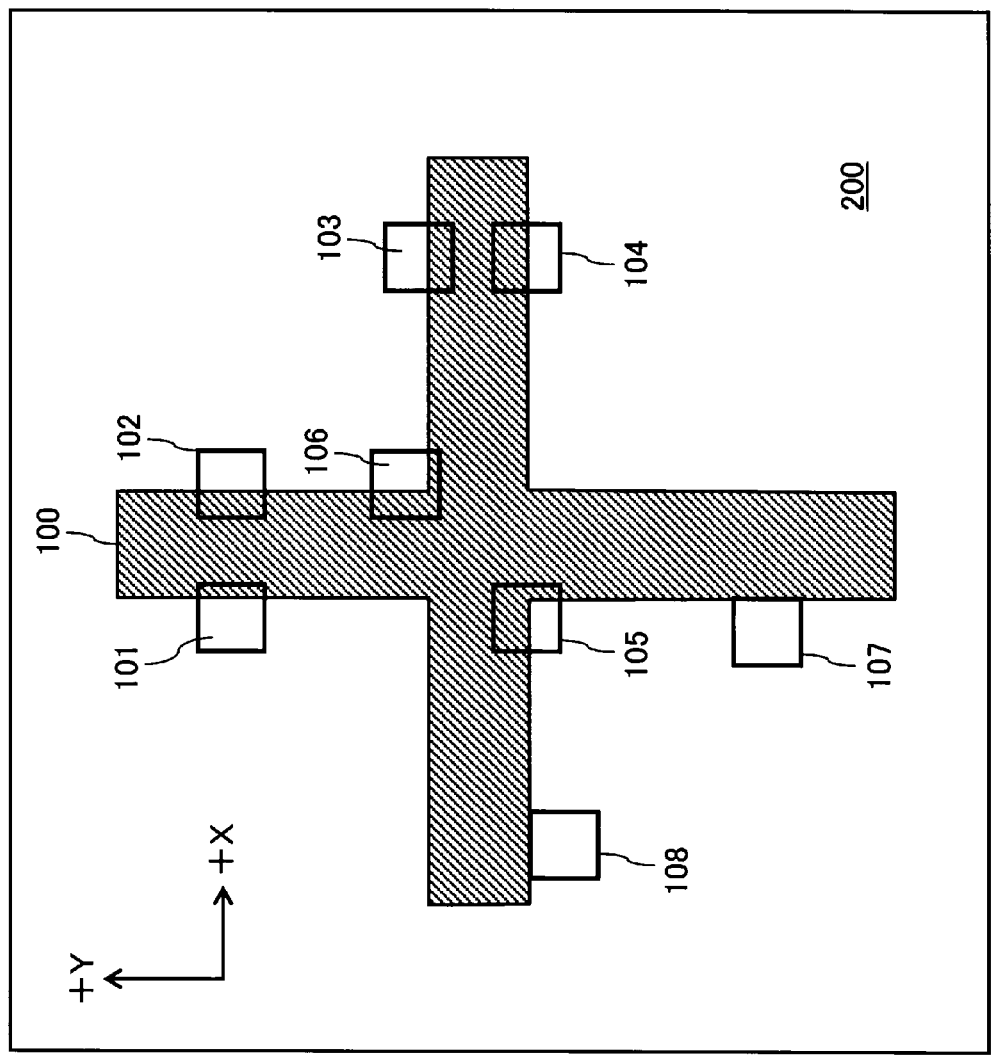
FIG. 3 is a schematic diagram illustrating a method of measuring the amount of beam drift according to the present embodiment.

Referring to FIG. 3, the reference numeral 100 denotes a reference mark on a substrate surface, and 101 to 108 denote portions of the substrate surface that are irradiated with an electron beam. More specifically, the irradiated portions 101 to 106 each include both the surface of a substrate and a part of the reference mark 100, and the irradiated portions 107 and 108 are contiguously adjacent the reference mark 100. The electron beam has a square shape, as can be seen from FIG. 3. Further, the reference mark 100 is a tungsten film formed on a silicon substrate 200. It should be noted that the present embodiment is not limited to the combination of this particular reference mark with this particular substrate. However, the greater the difference in reflectance between the reference mark and the substrate and the lower the reflectance of one of them, the more easily drift change can be detected.

When the silicon substrate 200 with the reference mark 100 thereon is irradiated with an electron beam, different quantities of electrons are reflected from the reference mark 100 and the surface of the silicon substrate 200. Specifically, more electrons are reflected from the former than from the latter. Therefore, the value of the current formed by the reflected electrons may be measured to detect the reference mark 100 and thereby determine the amount of drift of the electron beam. This method can repeat the measurement of the amount of drift at a rate of 1 MHz, i.e., complete each measurement cycle in approximately 1 microsecond. It should be noted that conventional methods measure the amount of drift by irradiating the substrate with an electron beam approximately 1000 times while deflecting the beam each time and thereby shifting its impinging position. The method of the present embodiment, on the other hand, can acquire many drift data samples at once without shifting the position of the reference mark. Furthermore, the time required for each sampling operation is only approximately one microsecond; that is, the sampling time is approximately one-thousandth of that required by conventional methods. Further, as described above, the A/D conversion unit 34 shown in FIG. 1 can store data received from the detecting unit 33, thus eliminating the need to send data to the control computer 19 each time a measurement is made. This reduces the time required for communication, thereby reducing the sampling time.

It should be noted that since the detector 32, the detecting unit 33, and the A/D conversion unit 34 generate noise components, the signal processing unit in the control computer 19 may perform averaging processing on the data to extract only the drift components. Further, in this averaging processing, the maximum and minimum values in the sampled data may be removed before the data is averaged. For example, if 20 pieces of data are averaged into one, then the acquisition of drift data can be repeated at a rate of one-twentieth of 1 MHz, i.e., approximately once every 20 microseconds. Even in this case the method of the present embodiment has an advantage over conventional methods, which take a time on the order of milliseconds (which is much longer than the time required by the method of the present embodiment) to obtain each piece of drift data. It should be noted that periodic noise may be removed from the drift data by FFT (Fast Fourier Transform).

The term "amount of positional drift" as used in connection with this embodiment refers to the amount of drift, or displacement, of the impinging position of an electron beam relative to the reference mark 100. Further, the term "amount of shape drift" refers to the amount of drift in the shape (or dimensions) of the electron beam 54 formed by the beam shaping aperture 18 shown in FIG. 1. It will be noted that naturally only positional drift occurs with unshaped electron beams.

Positional drift and shape drift will be described with reference to FIGS. 4A to 4C. In these figures, the reference numeral 300 denotes a reference mark on a substrate surface, and 301 to 303 denote portions of the substrate surface that are irradiated with an electron beam. The reference mark 300 is a tungsten film formed on a silicon substrate 400.

If the electron beam shown in FIG. 4A suffers drift after a certain time has elapsed, there will be a change in the quantity of reflected electrons detected. FIG. 4B shows the irradiated portion of the surface when positional drift in the Y direction has occurred, and FIG. 4C shows the irradiated portion of the surface when shape drift in the Y direction has occurred.

Table 1 and 2 below show exemplary changes in the amount of drift at irradiated portions 101 to 108. It is assumed for convenience of explanation that drift occurs only in X and Y directions. Therefore, the table lists the amount of positional drift in the X direction (+X), the amount of shape drift in the X direction (+X), the amount of positional drift in the Y-direction (+Y), and the amount of shape drift in the Y direction (+Y) at each irradiated portion.

TABLE 1

| | Irradiated Portion | | | |
|---|---|---|---|---|
| | 101 | 102 | 103 | 104 |
| Amount of Positional Drift (+X) | Increase | Decrease | None | None |
| Amount of Shape Drift (+X) | Increase | None | Increase | Increase |
| Amount of Positional Drift (+Y) | None | None | Decrease | Decrease |
| Amount of Shape Drift (+Y) | Increase | Increase | None | None |

TABLE 2

| | Irradiated Portion | | | |
|---|---|---|---|---|
| | 105 | 106 | 107 | 108 |
| Amount of Positional Drift (+X) | Increase | Increase and Decrease | Increase | None |
| Amount of Shape Drift (+X) | Increase | Increase | Increase | Increase |
| Amount of Positional Drift (+Y) | Increase | Increase and Decrease | None | Increase |
| Amount of Shape Drift (+Y) | Increase | Increase | Increase | Increase |

The shot size of the electron beam is represented herein by b (μm); the size of the overlap of the electron beam (or each irradiated portion) over the reference mark 100, k (μm); the amount of positional drift (+X), $\Delta p_x$ (μm); the amount of positional drift (+Y), $\Delta p_y$ (μm); the amount of shape drift (+X), $\Delta s_x$ (μm); and the amount of shape drift (+Y), $\Delta s_y$ (μm). Further, reference symbols A to H denote the amounts of change in the reflected electron signals at the irradiated portions 101 to 108, respectively. These parameters are represented by equations (1) to (8) below.

$$(k+\Delta p_x+\Delta s_x)(b+\Delta s_y)-kb=A \tag{1}$$

$$(k-\Delta p_x)(b+\Delta s_y)-kb=B \tag{2}$$

$$(b+\Delta s_x)(k-\Delta p_y)-kb=C \tag{3}$$

$$(b+\Delta s_x)(k-\Delta p_y)-bk=D \tag{4}$$

$$(k+\Delta p_x \Delta s_x)(b+\Delta p_y \Delta s_y)-b^2=E \tag{5}$$

$$(k-\Delta p_x)(\Delta p_y+\Delta s_y)-(k-\Delta p_y)(\Delta p_x+\Delta s_x)=F \tag{6}$$

$$(\Delta p_x + \Delta s_x)(b + \Delta s_y) = G \quad (7)$$

$$(\Delta p_y + \Delta s_y)(b + \Delta s_x) = H \quad (8)$$

Equation (1) can be expanded to produce equation (1').

$$k\Delta s_y + b\Delta p_x + \Delta p_x \Delta s_y + b\Delta s_x + \Delta s_x \Delta s_y = A \quad (1')$$

Equation (7) can be expanded to produce equation (7').

$$b\Delta p_x + \Delta p_x \Delta s_y + b\Delta s_x + \Delta s_x \Delta s_y = G \quad (7')$$

Subtraction of equation (7') from equation (1') yields:

$$k\Delta s_y = A - G \quad (9)$$

$$\therefore \Delta s_y = \frac{A - G}{k}$$

Substitution of equation (9) into equation (2) yields:

$$A - G - b\Delta p_x - \frac{A - G}{k}\Delta p_x = B \quad (10)$$

$$Ak - Gk - bk\Delta p_x - A\Delta p_x + G\Delta p_x = Bk$$

$$(G - A - bk)\Delta p_x = (B + G - A)k$$

$$\therefore \Delta p_x = \frac{(B + G - A)k}{G - A - bk}$$

Equation (4) can be expanded to produce equation (4').

$$k\Delta s_x + b\Delta s_y + b\Delta p_y + \Delta s_x \Delta p_y + \Delta s_x \Delta s_y = D \quad (4')$$

Equation (8) can be expanded to produce equation (8').

$$b\Delta s_y + b\Delta p_y + \Delta s_x \Delta p_y + \Delta s_x \Delta s_y = H \quad (8')$$

Subtraction of equation (8') from equation (4') yields:

$$k\Delta s_x = D - H \quad (11)$$

$$\therefore \Delta s_x = \frac{D - H}{k}$$

Substitution of equation (11) into equation (3) yields:

$$D - H - b\Delta p_y - \frac{D - H}{k}\Delta p_y = C \quad (12)$$

$$Dk - Hk - bk\Delta p_y - D\Delta p_x + H\Delta p_y = Ck$$

$$(H - D - bk)\Delta p_y = (C + H - D)k$$

$$\therefore \Delta p_y = \frac{(C + H - D)k}{H - D - bk}$$

To sum up, in the example shown in FIG. 3, the amount of positional drift (+X), $\Delta p_x$ (μm), is determined by equation (10); the amount of positional drift (+Y), $\Delta p_y$ (μm), equation (12); the amount of shape drift (+X), $\Delta s_x$ (μm), equation (11); and the amount of shape drift (+Y), $\Delta s_y$ (μm), equation (9). It should be noted that this calculation is done by the writing data correcting unit 31 shown in FIG. 1.

$$\Delta p_x = \frac{(B + G - A)k}{G - A - bk} \quad (10)$$

$$\Delta p_y = \frac{(C + H - D)k}{H - D - bk} \quad (12)$$

$$\Delta s_x = \frac{D - H}{k} \quad (11)$$

$$\Delta s_y = \frac{A - G}{k} \quad (9)$$

The drift measuring method described above allows detection and measurement of a change in the impinging position and in shape of the electron beam in a time close to the electron beam irradiation time. As a result, when the impinging position or the shape of the electron beam in the actual write operation differs from that in a test operation for electron beam adjustment, it is possible to determine whether the difference has resulted from electron beam drift or drift change. Therefore, this method greatly helps to pinpoint the cause of a change in the impinging position and shape of the electron beam.

For example, although in the present embodiment the electron beam has a square shape, it is to be understood that the electron beam may be shaped into different shapes, and the amount of change in the impinging position and in the shape of the electron beam due to drift may be determined for each shape of electron beam in the same manner as described above. The above method can determine the amount of change in the impinging position and the amount of change in the shape of the electron beam separately, whereas conventional methods cannot quantitatively determine these changes separately.

Further, although the present embodiment uses an electron beam, it is to be understood that the present invention is not limited to electron beams, but may be applied to other charged particle beams such as ion beams.

The features and advantages of the present invention may be summarized as follows.

The present invention enables detection of drift of a charged particle beam in a shorter time than conventionally possible.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-109013, filed on Apr. 28, 2009 including specification, claims, drawings and summary, on which the Convention priority of the present application is based, are incorporated herein by reference in its entirety.

What is claimed is:

1. A method of measuring drift of a charged particle beam, comprising:

individually irradiating a plurality of positions in the area on and around a reference mark with the charged particle beam, wherein the positions include either a surface of a substrate contiguously adjacent to the reference mark; or a surface of the substrate and a part of the reference mark formed on the substrate, wherein the reference mark is made of a material having a different reflectance than that of the substrate;

measuring a value of a current formed by reflected charged particles generated as a result of the irradiation; and measuring the drift of the charged particle beam based on an amount of change in the current value, and wherein said individually irradiated positions are spatially separated from each other by positions that are not irradiated by the charged particle beam.

2. The method according to claim 1, further comprising performing A/D conversion and averaging processing on said current value.

3. The method according to claim 1, wherein said substrate is a silicon substrate and said reference mark is a tungsten film.

4. A method of writing with a charged particle beam, comprising:
individually irradiating a plurality of positions in an area on and around a reference mark with the charged particle beam, wherein the positions include either a surface of a substrate contiguously adjacent to the reference mark or a surface of the substrate and a part of the reference mark formed on the substrate, wherein the reference mark is made of a material having a different reflectance than that of the substrate;
measuring a value of a current formed by reflected charged particles generated as a result of the irradiation; and
determining an amount of change in the position of the charged particle beam due to drift of the charged particle beam based on an amount of change in the current value and correcting an impinging position of the charged particle beam accordingly, and
wherein said individually irradiated positions are spatially separated from each other by positions that are not irradiated by the charged particle beam.

5. The method according to claim 4, wherein:
all said positions are irradiated with said charged particle beam after said charged particle beam is shaped into a predetermined shape; and
said method further comprises determining the amount of change in the position of said charged particle beam and the amount of change in the shape of said charged particle beam due to said drift based on the amount of change in said current value and correcting the impinging position and the shape of said charged particle beam accordingly.

6. The method according to claim 4, further comprising performing A/D conversion and averaging processing on said current value.

7. The method according to claim 4, wherein said substrate is a silicon substrate and said reference mark is a tungsten film.

8. A charged particle beam writing apparatus comprising:
a reference mark on a substrate provided in a writing chamber in which a workpiece is placed, said reference mark being of a material having a different reflectance than said substrate;
a detector configured to measure a value of a current formed by reflected charged particles generated as a result of irradiation of said reference mark with a charged particle beam;
a correcting unit configured to perform drift compensation based on a signal from said detector; and
a control computer configured to control irradiation of the charged particle beam to individually irradiate a plurality of positions in an area on and around the reference mark,
wherein the positions include either a surface of a substrate contiguously adjacent to the reference mark or a surface of the substrate and a part of the reference mark formed on the substrate; and
said correcting unit calculates an amount of change in the position of said charged particle beam due to drift of said charged particle beam and corrects an impinging position of said charged particle beam accordingly, and
wherein said individually irradiated positions are spatially separated from each other by positions that are not irradiated by the charged particle beam.

9. The charged particle beam writing apparatus according to claim 8, wherein said correcting unit also calculates an amount of change in the shape of said charged particle beam due to said drift and corrects a shape of said charged particle beam accordingly.

10. The charged particle beam writing apparatus according to claim 8, further comprising:
a detecting unit configured to amplify a signal received from said detector;
an A/D conversion unit configured to convert a signal received from said detecting unit to a digital signal; and
a signal processing unit configured to perform averaging processing on a signal received from said A/D conversion unit;
wherein said correcting unit performs said drift compensation based on data generated by said signal processing unit.

11. The charged particle beam writing apparatus according to claim 10, wherein said correcting unit also calculates the amount of change in the shape of said charged particle beam due to said drift and corrects a shape of said charged particle beam accordingly.

12. The charged particle beam writing apparatus according to claim 8, wherein the charged particle beam is irradiated without shifting a position of the reference mark during the individual irradiating.

13. The method according to claim 1, comprising irradiating the charged particle beam without shifting a position of the reference mark during the individual irradiating.

14. The method according to claim 4, comprising irradiating the charged particle beam without shifting a position of the reference mark during the individual irradiating.

* * * * *